(12) United States Patent
Aritome

(10) Patent No.: US 8,018,778 B2
(45) Date of Patent: Sep. 13, 2011

(54) MEMORY READ METHODS, APPARATUS, AND SYSTEMS

(75) Inventor: Seiichi Aritome, Zhudong Town (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/846,596

(22) Filed: Jul. 29, 2010

(65) Prior Publication Data

US 2010/0309728 A1 Dec. 9, 2010

Related U.S. Application Data

(63) Continuation of application No. 11/945,787, filed on Nov. 27, 2007, now Pat. No. 7,768,839.

(51) Int. Cl.
*G11C 16/06* (2006.01)
(52) U.S. Cl. ......... 365/185.24; 365/185.23; 365/189.04; 365/189.15
(58) Field of Classification Search ............. 365/185.24, 365/185.23, 189.04, 189.15
See application file for complete search history.

(56) References Cited

U.S. PATENT DOCUMENTS

| | | | |
|---|---|---|---|
| 6,026,014 A * | 2/2000 | Sato et al. | ................ 365/185.03 |
| 7,768,839 B2 | 8/2010 | Aritome | |
| 2004/0255090 A1 | 12/2004 | Guterman et al. | |
| 2009/0135654 A1 | 5/2009 | Aritome | |

* cited by examiner

*Primary Examiner* — Thong Q Le
(74) *Attorney, Agent, or Firm* — Schwegman, Lundberg & Woessner, P.A.

(57) ABSTRACT

Some embodiments include first memory cells and a first line used to access the first memory cells, second memory cells and at least one second line used to access the second memory cells. The first and second memory cells have a number of threshold voltage values corresponding to a number of states. The states represent values of information stored in the memory cells. During a read operation to read the first memory cells, a first voltage may be applied to the first line and a second voltage may be applied to the second line. At least one of the first and second voltages may include a value based on a change of at least one of the threshold voltage values changing from a first value to a second value. The first and second values may correspond to a unique state selected from all of the states. Other embodiments including additional apparatus, systems, and methods are disclosed.

17 Claims, 7 Drawing Sheets

MEMORY READ METHODS, APPARATUS, AND SYSTEMS

CLAIM OF PRIORITY

This application is a continuation of and claims the benefit of priority under 35 U.S.C. §120 to U.S. patent application Ser. No. 11/945,787 filed on Nov. 27, 2007, now issued as U.S. Pat. No. 7,768,839, which is hereby incorporated by reference herein in its entirety.

BACKGROUND

Semiconductor devices such as flash memory devices are often present in computers and other electronic products (e.g., digital television, digital cameras, digital audio players, and memory cellular phones) to store data and other information. Flash memory devices may also be used as portable storage devices, such as portable Universal Serial Bus (USB) flash drives or "thumb" drives. Flash memory devices may retain the information stored in the device even when power is disconnected from the device.

A flash memory device stores information in numerous memory cells, which are usually formed in a semiconductor chip. Each of the memory cells often has a metal-oxide semiconductor (MOS) transistor with two different transistor gates: a control gate and a so-called "floating" gate. The control gate may be used to turn the transistor on and off to control access to the memory cell. The floating gate may be used to store one or more bits in each memory cell.

The number of electrons in the floating gate may determine the value of the information stored in memory cell. Different numbers of electrons in the floating gate may correspond to different values of information. The number of electrons in the floating gate may be varied by either adding electrons to or extracting electrons from the floating gate. A flash memory device usually has a programming operation (which is also sometimes referred to as a write operation) to add electrons to the floating gate, and an erase operation to extract electrons from the floating gate. Information in the memory cells may be read in a read operation. Each memory cell has a threshold voltage value dependent on the number of electrons in the floating gate. A read operation determines the threshold voltage value of the memory cell being read to provide the value of the information stored in the memory cell.

DETAILED DESCRIPTION

The inventor has discovered that in some cases, the threshold voltage values of the memory cells may change due to factors such as leakage in the memory cells, disturbances in the memory cells caused by programming and read operations, and the length of time that information has been stored in the memory cells. The change in the threshold voltage values may reduce the reliability of information read from the memory cells. The inventor has also discovered a variety of apparatus, systems, and methods that may be used to address at least a portion of these challenges, as explained in detail below.

Figure 1:
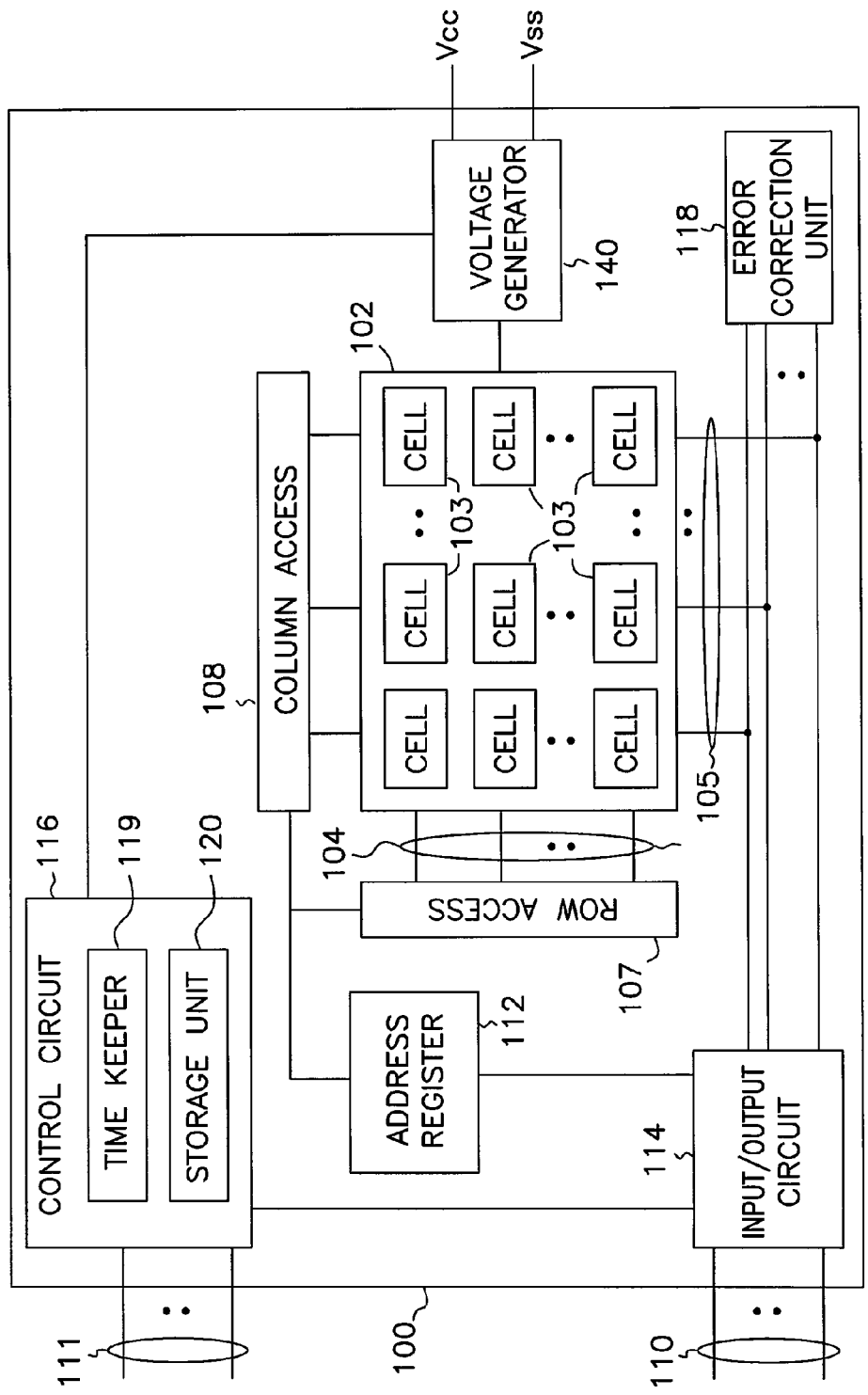
FIG. 1 shows a block diagram of a memory device according to an embodiment of the invention.

FIG. 1 shows a block diagram of a memory device 100 according to an embodiment of the invention. Memory device 100 may include a memory array 102 with memory cells 103 arranged in rows and columns along with lines 104 and lines 105. Lines 104 and 105 may correspond to wordlines and bit lines, respectively, of a memory device. Memory device 100 may use lines 104 to access memory cells 103 and lines 105 to transfer information with memory cells 103. Row access and column access circuitry 107 and 108 may respond to an address register 112 to access memory cells 103 based on row address and column address signals on terminals 110, 111 or both. A data input/output circuit 114 may transfer data between memory cells 103 and terminals 110. Terminals 110 and 111 may be external terminals of memory device 100 (e.g., terminals exposed outside a chip or semiconductor package that contains memory device 100).

A control circuit 116 may control operations of memory device 100 based on signals present on terminals 110 and 111. A device (e.g., a processor or a memory controller) external to memory device 100 may send different commands (e.g., programming commands and read commands) to memory device 100 using different combinations of signals on terminals 110, 111, or both.

Memory device 100 may respond to the commands to perform operations such as programming, read, and erase operations. A programming operation may write data from terminals 110 to memory cells 103 (e.g., transfer data from terminals 110 to memory cells 103). A read operation may read data from memory cells 103 to terminals 110 (e.g., transfer data from memory cells 103 to terminals 110). An erase operation may erase data (e.g., clear data) from all memory cells 103 or from a portion of memory cells 103.

Memory device 100 may receive supply voltages Vcc and Vss. Vcc may include a positive voltage value, and Vss may include a ground potential. Memory device 100 may also include a voltage generator 140. Voltage generator 140 and control circuit 116 may act separately or together to provide different voltages to memory array 102 or to cause memory array 102 to receive different voltages during the operations (e.g., read operations) of memory device 100.

Memory device 100 may include an error correction unit 118 to check for errors in information read from memory cells 103. Error correction unit 118 may include error correction circuitry to correct errors based on error correction code (ECC), as is well-known to those of ordinary skill in the art. Memory device 100 may include a time keeper 119 to keep track of real time. The real time may be provided by a real-time clock, which may reside inside or outside memory device 100.

Memory device 100 may include a storage unit 120, which may include storage components such as flash memory cell components, read only memory (ROM) components, registers, and combinations thereof. Storage unit 120 may store data as a result of receiving different voltage values for use in operations such as read operations of memory device 100. Storage unit 120 may include a hardware portion, a firmware portion, or both, of memory device 100. Storage unit 120 may also be used to store codes (e.g., software programming instructions).

Memory device 100 may include a flash memory device such as a NAND flash or a NOR flash memory device, and other kinds of memory devices.

Memory device 100 may include a single-level-cell memory device such that memory cells 103 store information to represent a value of a single bit of data. For example, memory cells 103 may store information that represents either a binary "0" value or a binary "1" value of a single bit of data.

Memory device 100 may include a multi-level-cell (MLC) memory device such that memory cells 103 may store information to represent a value of multiple bits of data (e.g., a value of two, three, four, or some other number of bits of data). For example, when each of memory cells 103 is a two-bit per cell, each of memory cells 103 may store information to represent a value corresponding to one of four possible combinations of two bits of data (i.e., combination 00, 01, 10, and 11 of two bits of data). In another example, when each of memory cells 103 is a three-bit per cell, each of memory cells 103 may store information to represent a value corresponding to one of eight possible combinations of three bits of data (i.e., one of 000, 001, 010, 011, 100, 101, 110, and 111). In another example, when each of memory cells 103 is a four-bit per cell, each of memory cells 103 may store information to represent one of 16 possible binary combinations of four bits of data (i.e., one of 0000, 0001, 0010, 0011, 1000, and so on, up to 1111).

Single level and MLC memory devices may be combined within the device 100. One of ordinary skill in the art will readily recognize that memory device 100 may include other parts, which are omitted from FIG. 1 to help focus on the various embodiments described herein. Memory device 100 may include one or more of the embodiments described below with reference to FIG. 2 through FIG. 7.

As mentioned above, factors such as leakage in the memory cells, disturbances in the memory cells, and length of storage time, may cause the threshold voltage values of the memory cells to change. The change may reduce the reliability of information read from the memory cells. To help maintain the reliability of information read from memory cells 103 during a read operation, memory device 100 may read memory cells 103 using voltage values that are based on changes in the threshold voltage values of memory cells 103. Memory device 100 may include read operations that are similar to or identical to those described below with reference to FIG. 2 through FIG. 7.

Figure 2:
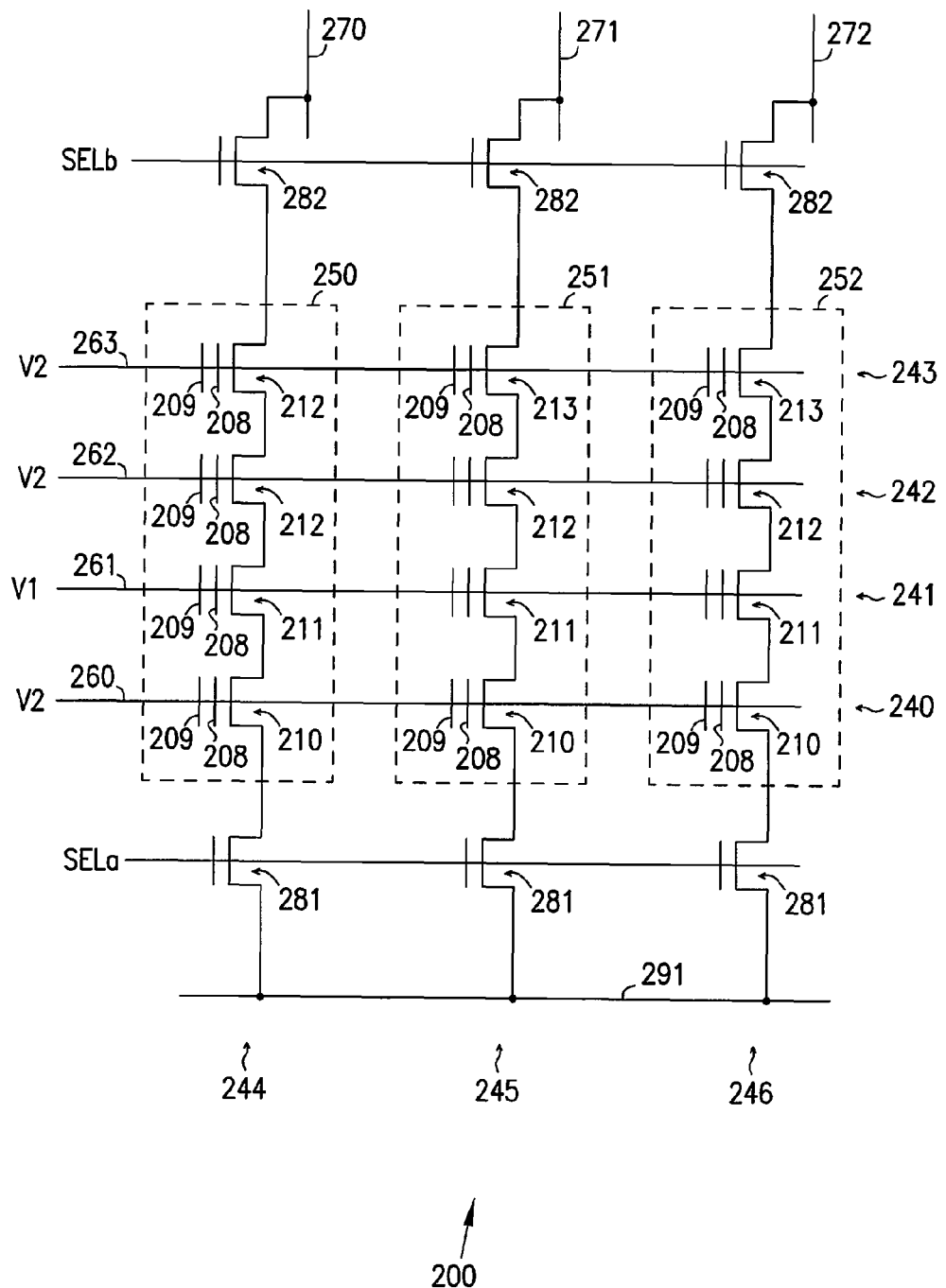
FIG. 2 shows a partial schematic diagram of a memory device according to an embodiment of the invention.

FIG. 2 shows a partial schematic diagram of a memory device 200 according to an embodiment of the invention. Memory device 200 may be associated with memory device 100 of FIG. 1, perhaps forming a portion of memory array 102 of memory device 100. In FIG. 2, memory device 200 may include memory cells 210, 211, 212, and 213, arranged in rows 240, 241, 242, and 243, and columns 244, 245, and 246. The memory cells in the same column may be connected in a series (sometimes called a string) of memory cells, such as strings 250, 251, and 252. FIG. 2 shows an example of three strings with four memory cells in each string. The number of strings, memory cells, or both may vary.

As shown in FIG. 2, each of the memory cells may include a floating gate 208 and a control gate 209. Control gates 209 of memory cells in the same row (e.g., row 220) may be coupled to one of lines 260, 261, 262, and 263. These lines may correspond to portions of wordlines of a memory device. Memory device 200 may use lines 260, 261, 262, and 263 to access memory cells 210, 211, 212, and 213 during a read operation to read information stored in memory cells 210, 211, 212, and 213, and during a programming operation to write information into memory cells 210, 211, 212, and 213. Memory device 200 may use lines 270, 271, and 272 to transfer information to be stored into memory cells 210, 211, 212, and 213 during a programming operation, and to transfer the information read from these memory cells during a read operation. Memory device 200 may include transistors 281 and 282 (responsive to signals SELa and SELb, respectively) to couple strings 250, 251, and 252 to lines 270, 271, and 272 and line 291. Lines 270, 271, and 272 may correspond to portions of bit lines of a memory device. Line 291 may correspond to a portion of a source (voltage) line of a memory device. Line 291 may be coupled to a ground potential during a read operation.

Memory device 200 may write information into memory cells 210, 211, 212, and 213 in a programming operation. As mentioned above, the information stored in a memory cell (e.g., one of memory cells 210, 211, 212, and 213) depends on the number of electrons in the floating gate of the memory cell (e.g., floating gate 208).

Memory device 200 may read memory cells 210, 211, 212, and 213 during a read operation to obtain the information stored in these memory cells. Memory device 200 may determine the value of information read from these cells based on the number of electrons stored in these memory cells. During a read operation, memory device 200 may apply different voltages (e.g., voltages V1 and V2 in FIG. 2) to lines 260, 261, 262, and 263 to read selected memory cells among memory cells 210, 211, 212, and 213. In the description herein, selected memory cells refer to the memory cells that are selected to be read in a particular read operation, and unselected memory cells refer to the memory cells that are not selected to be read in that particular read operation. The values of the signals on terminals, such as terminals 110 and 111 of FIG. 1, may determine which memory cells are selected to be read in a read operation.

FIG. 2 shows an example where memory cells 211 are selected memory cells (to be read in a read operation) and the other memory cells 210, 212, and 213 are unselected memory cells (not to be read in the read operation). As shown in the example of FIG. 2, during a read operation, memory device 200 may apply voltage V1 to line 261 associated with the selected memory cells 211 and apply the same voltage V2 to other lines 260, 262, and 263 associated with the unselected memory cells 210, 212, and 213. In another example, if memory device 200 selects memory cells 213 (instead of memory cells 211) to be read during a read operation, then memory device 200 may apply voltage V1 to lines 263 associated with memory cells 213 and apply the same voltage V2 to other lines 260, 261, and 262 associated with the unselected memory cells 210, 211, and 213.

In the example shown in FIG. 2, memory device 200 may use a substantially constant value for voltage V2 (e.g. about five to six volts) to cause memory cells 210, 212, and 213 (unselected memory cells) to operate as pass elements during a read operation to pass information from memory cells 211 (selected memory cells) to lines 270, 271, and 272. As mentioned above, the value of the information stored in a memory cell may depend on the threshold voltage value of the memory cell. Memory device 200 may apply various values for V1 to read the selected memory cells based on the threshold voltage values of the selected memory cells (memory cells 211 in this example).

Figure 3:
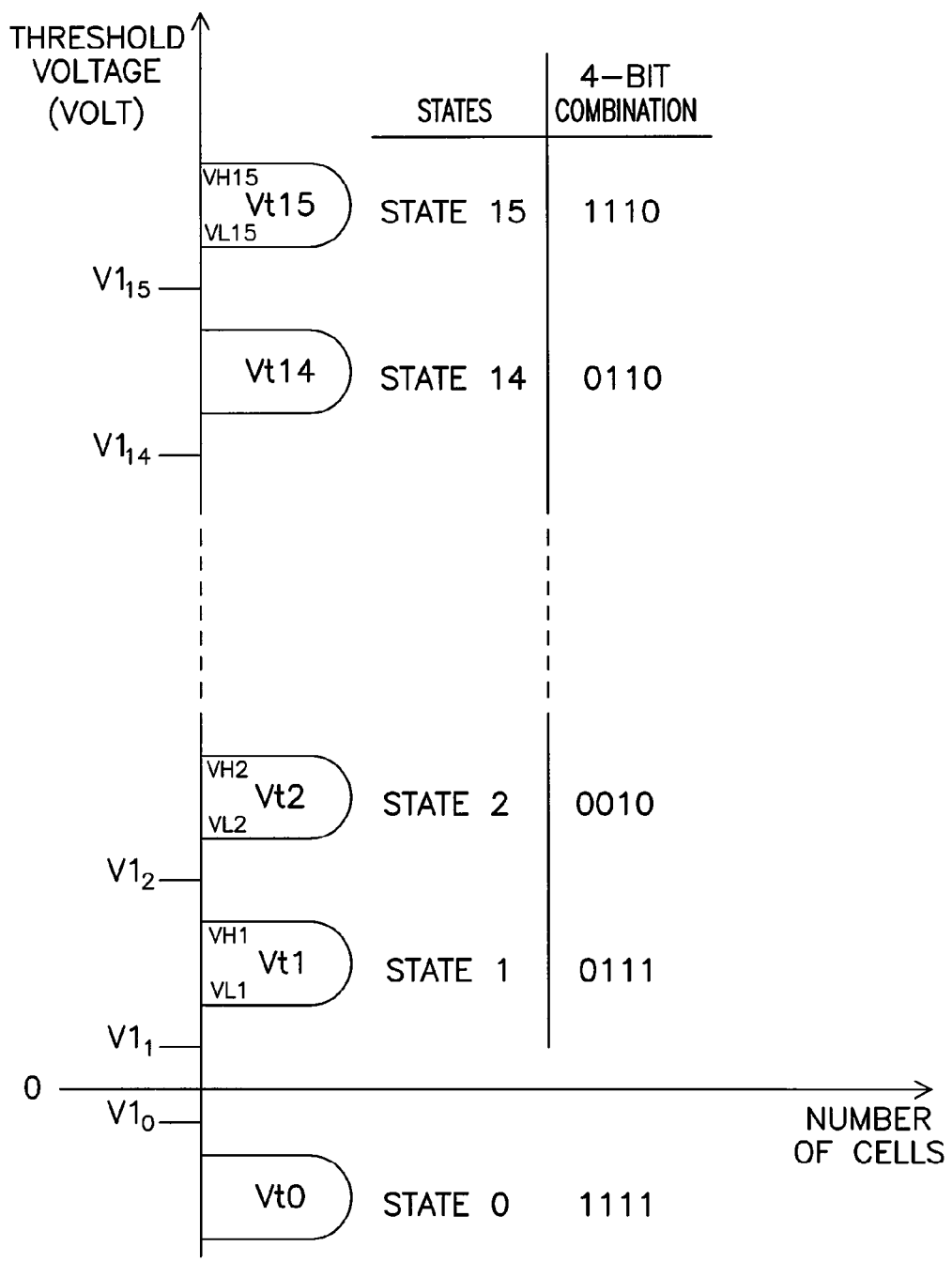
FIG. 3 shows an example of threshold voltage value distribution of the memory device of FIG. 2.

FIG. 3 shows an example of threshold voltage value distribution of memory device 200 of FIG. 2. Referring now to FIG. 2 and FIG. 3, it can be seen that Vt0 through Vt15 represent 16 different threshold voltage values that each of memory cells 210, 211, 212, and 213 may have when each of memory cells 210, 211, 212, and 213 is a 4-bit cell. Each of 16 threshold voltage values Vt0 through Vt15 in FIG. 3 may be within a different range of values. For example, threshold voltage value Vt1 may be within a range of values VL1 to VH1, threshold voltage value Vt2 may be within a range of values VL2 to VH2, and threshold voltage value Vt15 may be within a range of values VL15 to VH15.

Each of threshold voltage values Vt0 through Vt15 may correspond to one of 16 states (a state is sometimes called a level). In multiple bits, each state may represent one of a number of possible combinations of the multiple bits. For example, for four bits, each state may represent one of 16 combinations of the four bits. In FIG. 3, each of threshold voltage values Vt0 through Vt15 may correspond to one of 16 states, where each of 16 states may represent one of 16 combinations of four bits. For example, as shown in FIG. 3, state 0 may represent combination 1111, state 1 may represent combination 0111, and state 2 may represent combination 0010, state 14 may present combination 0110, and state 15 may present combination 1110. FIG. 3 shows each state representing a specific combination (e.g., state 1 representing combination 1110) as an example. Each state, however, may represent a combination that is different from the one shown in FIG. 3.

FIG. 3 also shows voltage values $V1_0$, $V1_1$, and $V1_2$ through $V1_{15}$, which may correspond to various values of V1 in FIG. 2 that memory device 200 may apply to line 261 during a read operation. Memory device 200 may use each of values $V1_0$, $V1_1$, and $V1_2$ through $V1_{15}$ to read information corresponding to one of threshold voltage values Vt0 through Vt15. For example, memory device 200 may use value $V1_0$, $V1_1$, and $V1_{15}$ to read information corresponding to threshold voltage values Vt0, Vt1, and Vt15, respectively. FIG. 3 shows value $V1_1$ being higher than zero volts as an example. Value $V1_1$, however, may include zero volts.

In FIG. 3, values $V1_0$, $V1_1$, and $V1_2$ through $V1_{15}$ are known values, which are based on the design and structure of the memory cells of the memory device 200. These values may be scaled linearly along the vertical axis (threshold voltage axis) of FIG. 3. For example, values $V1_0$, $V1_1$, and $V1_2$ through $V1_{15}$ may be scaled linearly such that $V1_1$ may have a value of 0.3 volt, $V1_2$ may have a value of 0.6 volt, $V1_3$ (not shown in FIG. 3) may have a value of 0.9 volt, $V1_4$ (not shown in FIG. 3) may have a value of 1.2 volts, $V1_{14}$ may have a value of 4.2 volts, and $V1_{15}$ may have a value of 4.5 volts. Values $V1_0$, $V1_1$, and $V1_2$ through $V1_{15}$ may be scaled in a nonlinear fashion.

During a read operation, memory device 200 (FIG. 2) may apply values $V1_0$, $V1_1$, and $V1_2$ through $V1_{15}$ of FIG. 3 to line 261 in a sequential fashion (e.g., from $V1_0$ to $V1_{15}$) to read information from the selected memory cells. Memory device 200 may read information from memory cells 210, 211, 212, and 213 using conventional techniques. However, memory device 200 may use voltage V1 or V2 (or both) during a read operation in which the value of voltage V1 or the value of voltage V2 (or both) may be selected by methods described below with reference to FIG. 4, FIG. 5, and FIG. 6.

As mentioned above, many factors may cause the threshold voltage values of the memory cells to change, thereby reducing the reliability of information read from the memory cells. In FIG. 3, threshold voltage values Vt0 through Vt15 memory cells 210, 211, 212, and 213 may change. To help maintain the reliability of information read from memory cells 210, 211, 212, and 213 when threshold voltage values Vt0 through Vt15 change, memory device 200 may read memory cells 210, 211, 212, and 213 using a value of voltage V2 and various values of voltage V1 in which the values of voltages V1 and V2 may be based on changes in the threshold voltage values Vt0 through Vt15.

Memory device 200 may have selectable values for voltage V1, selected in ways described below with reference to FIG. 4 and FIG. 5. Memory device 200 may operate to select the value for voltage V2 in ways described below with reference to FIG. 6.

Figure 4:
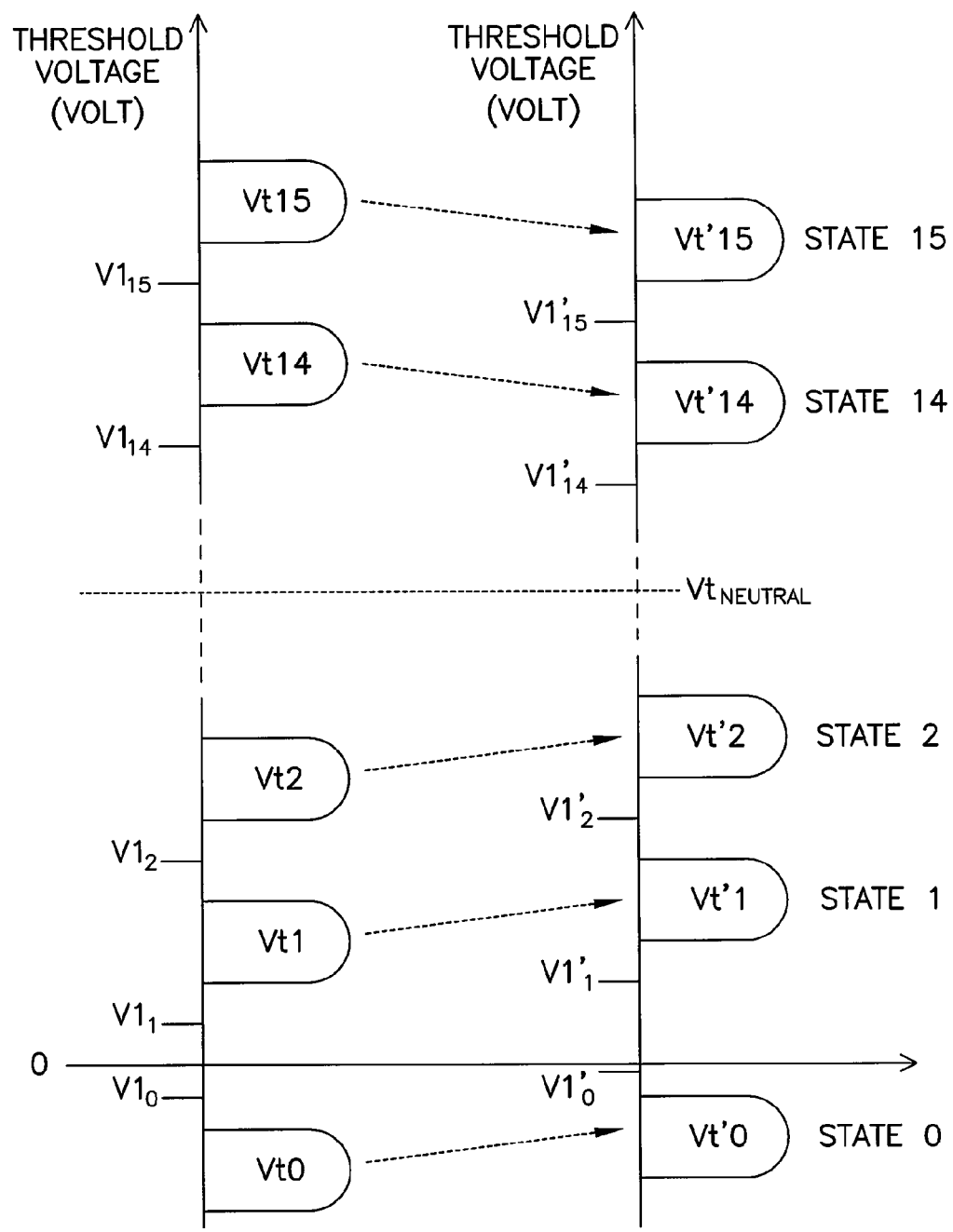
FIG. 4 shows examples of changes in threshold voltage values of the memory device of FIG. 2.

FIG. 4 shows examples of changes in threshold voltage values of memory device 200 of FIG. 2. Thus, the threshold voltage values Vt0 through Vt15 (also shown in FIG. 3) may change to Vt'0 through Vt'15. The arrows in FIG. 4 symbolically indicate the changes in the threshold voltage values.

Value $Vt_{NEUTRAL}$ in FIG. 4 represents a "neutral" threshold voltage value of memory cells of memory device 200. Value $Vt_{NEUTRAL}$ may represent a neutral threshold voltage value of a memory cell when no charge (e.g., no extra electrons) or substantially no charge is present on the floating gate of the memory cell. The value of $Vt_{NEUTRAL}$ may depend on the physical structure of the memory cell such as transistor channel length, width, and material doping concentration (e.g., doping concentration of a semiconductor material where the memory cells may be formed). In an example, the value of the neutral threshold voltage value (such as $Vt_{NEUTRAL}$ of FIG. 4) of memory cells (e.g., memory cells 210, 211, 212, and 213) may be about zero volts to about one volt. In the example of FIG. 4, value $Vt_{NEUTRAL}$ may be about 0.9 volt. Other values for $Vt_{NEUTRAL}$ may be selected, including negative values.

As shown in FIG. 4, the threshold voltage values (Vt0 through Vt15) may change and move toward value $Vt_{NEUTRAL}$ such that the threshold voltage values greater than value $Vt_{NEUTRAL}$ (e.g., Vt15 and/or Vt14) may decrease in value, and the threshold voltage values less than value $Vt_{NEUTRAL}$ (e.g., Vt1 and/or Vt2,) may increase in value. For example, as shown in FIG. 4, threshold voltage value Vt1 may increase in value (move up toward value $Vt_{NEUTRAL}$ along the threshold voltage axis) while threshold voltage value Vt15 may decrease in value (move down toward value $Vt_{NEUTRAL}$ along the threshold voltage axis). In FIG. 4, although each of threshold voltage values Vt0 through Vt15 may change in value, the value of each of threshold voltage values Vt0 through Vt15 before and after the change may still correspond to the same state. For example, as shown in FIG. 4, although threshold voltage value Vt1 may increase to threshold voltage value Vt'1, the values of Vt1 and Vt'1 may still correspond to the same state (e.g., state 1). In another example, as shown in FIG. 4, although threshold voltage value Vt15 may decrease to threshold voltage value Vt'15, the values of Vt15 and Vt'1 may still correspond to the same (e.g., state 15).

Since threshold voltage values Vt0 through Vt15 may change, the reliability of the information read from the selected memory cells may be maintained if new values (selected in ways described below) are used instead of the old values of $V1_0$, $V1_1$, and $V1_2$ through $V1_{15}$; because one or more of the old values may be inside, too close to, or too far from one or more ranges of the changed threshold voltage values (Vt'0 through Vt'15), thereby reading information from the selected memory cell using the old values ($V1_0$, $V1_1$, and $V1_2$ through $V1_{15}$) may give false or inaccurate results. Values $V1'_0$, $V1'_1$, and $V1'_2$ through $V1'_{15}$ in FIG. 4 may correspond to the new values of $V1_0$, $V1_1$, and $V1_2$ through $V1_{15}$. Each of values $V1'_0$, $V1'_1$, and $V1'_2$ through $V1'_{15}$ may correspond to one of values $V1_0$, $V1_1$, and $V1_2$ through $V1_{15}$ but may have a different value, and may change in the same direction as that of the corresponding threshold voltage values Vt0 through Vt15. For example, $V1'_1$ may correspond to $V1_1$ but have a value increased in the same direction as that of threshold voltage value Vt1, and $V1'_{15}$ may correspond to $V1_{15}$ but may have a value decreased in the same direction as that of threshold voltage value Vt15 decreasing to Vt'15. Memory device 200 (FIG. 2) may use $V1'_0$, $V1'_1$, and $V1'_2$ through $V1'_{15}$ during a read operation to read selected memory cells such as memory cells 211. Memory device 200 (FIG. 2) may operate to select the values of V1 (select values $V1'_0$, $V1'_1$, and $V1'_2$ through $V1'_{15}$) using a method similar to or identical to those described below with reference to FIG. 5.

Figure 5:
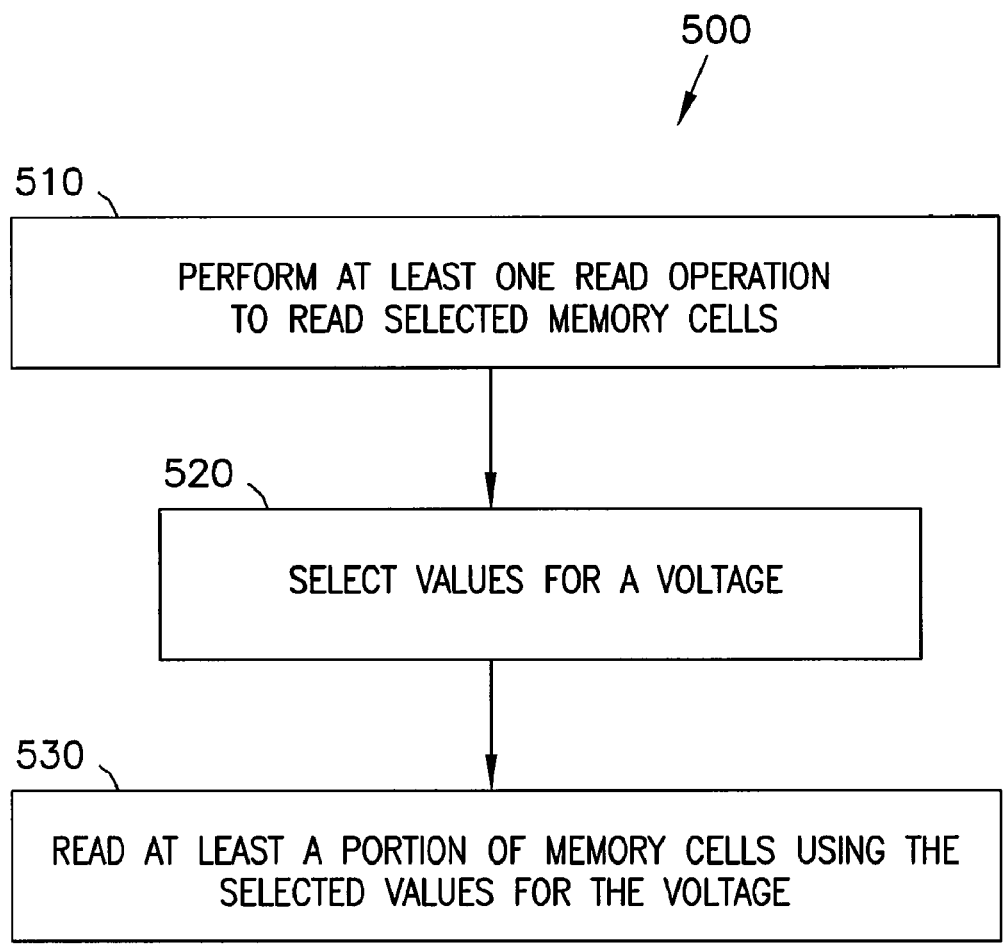
FIG. 5 is a flow diagram showing methods of selecting values for a voltage to be applied to lines associated with selected memory cells of a memory device during a read operation according to an embodiment of the invention.

FIG. 5 is a flow diagram showing methods 500 of selecting values for a voltage V1 to be applied to lines associated with selected memory cells of a memory device during a read operation according to an embodiment of the invention. The memory device used in methods 500 may be associated with memory device 200 of FIG. 2. The selected memory cells in methods 500 may be associated with memory cells 211 of FIG. 2. The unselected memory cells in methods 500 may be associated with memory cells 210, 212, and 213 of FIG. 2. Methods 500 may include at least three different ways to select values for voltage V1 (i.e., three different ways to select values $V1'_0$, $V1'_1$, and $V1'_2$ through $V1'_{15}$ of FIG. 4) with each of the three different ways being based on changes in the threshold voltage values of the memory cells.

Activity 510 of methods 500 may include performing at least one read operation to read selected memory cells of the memory device. Activity 510 may include starting to perform the read operation when the memory device receives a read command from an external device such as a processor. Activity 510 may include generating one or more internal read commands to perform the read operations for the purposes of selecting (e.g., calibrating) the values for voltage V1 as explained below. The internal read command(s) in activity 510 may be different from the (external) read command sent to the memory device by an external device. Activity 510, in some cases, may not operate to transfer the information read from the selected memory cells to terminals of the memory device (e.g., terminals similar to or identical to terminals 110 of FIG. 1) for further processing. Instead, methods 500 may use the information read by activity 510 for purposes of selecting values (performed by activity 520) for voltage V1. After engaging in activity 520, methods 500 may include performing a subsequent read operation (e.g., in activity 530) using the selected values for V1, and then transfer the information read in the subsequent read operation to other components (e.g., to the external device) for further processing. Methods 500 may include selecting the values for voltage V1 based on changes in the threshold voltage value with a highest value (e.g., Vt15) and the threshold voltage value with a lowest positive value (e.g., Vt1).

During a read operation, activity 510 may operate to apply voltage V1 to a line associated with the selected memory cells (e.g., a line similar to or identical to line 261 of FIG. 2). Activity 510 may then operate to apply a second voltage (e.g., similar to voltage V2) to other lines associated with the unselected memory cells (e.g., lines similar to or identical to lines 260, 262, and 263 of FIG. 2). Activity 510 may include performing more than one read operations to read the same selected memory cells but may use different set of values for voltage V1 (different sets of $V1_0$, $V1_1$, and $V1_2$ through $V1_{15}$) in different read operations within activity 510. The values of voltage V1 used in activity 510 may initially include the values $V1_0$, $V1_1$, and $V1_2$ through $V1_{15}$ (which are known values based on design and structures of the memory cells, as mentioned above with reference to FIG. 3). Activity 510 may include selectively increasing or decreasing one or more of values $V1_0$, $V1_1$, and $V1_2$ through $V1_{15}$ during the process of selecting the values for voltage V1. For example, activity 510 may use voltage V1 with value $V1_1$ of about 0.3 volt and value $V1_{15}$ of about 4.5 volts in a first read operation (and other appropriate values for $V1_2$ through $V1_{14}$). In a second read operation, activity 510 may operate to increase value $V1_1$ by an incremental value (e.g., 50 millivolts or some other incremental value) and to decrease $V1_{15}$ by a decremented value (e.g., 50 millivolts or other decremented value). Activity 510 may operate to increase and decrease the values of $V1_1$ and $V1_{15}$, respectively, because it may anticipate that the threshold voltage values (e.g., (Vt1 and Vt15) corresponding $V1_1$ and $V1_{15}$ may decrease or increase (e.g., may move toward the value $Vt_{NEUTRAL}$) as mentioned above in the description with respect to FIG. 4. Activity 510 may use the same known values for $V1_0$, $V1_1$, and $V1_2$, through $V1_{14}$. Activity 510 may also operate to appropriately increase or decrease the known values for $V1_0$, and $V1_2$ through $V1_{14}$, depending on each of these values relative to value $Vt_{NEUTRAL}$.

Activity 510 may include tracking (e.g., storing) of values $V1_1$ and $V1_{15}$ (new values) from the read operations. For example, if activity 510 performs several read operations (in response to internal read commands), activity 510 may have several tracked values of $V1_1$ and several tracked values of $V1_{15}$. The tracked values of $V1_1$ and $V1_{15}$ refer to the values of $V1_1$ and $V1_{15}$ at which activity 510 successfully reads information from the selected memory cells. Activity 510 may select one of the tracked values of $V1_1$ and one of the tracked values of $V1_{15}$ for calculation (performed by activity 520 below) to select values (new values) for voltage V1 (e.g., $V1'_0$, $V1'_1$, and $V1'_2$ through $V1'_{15}$ of FIG. 4). Methods 500 may use the selected values of voltage V1 for one or more subsequent read operations (read operations performed after activity 510). In activity 510, if there are, for example, three tracked values of $V1_1$ with values 0.3 v, 0.35 v, and 0.4 v ("v" means volt) that activity 510 used to successfully read the information from the selected memory cells, then activity 510 may select the middle of $V1_1$ (or 0.35 v) to be used in the calculation to select the values for V1. In another example, if there are three tracked values of $V1_{15}$ with values 4.5 v, 4.45 v, and 4.4 v, then activity 510 may select the middle $V1_{15}$ or 4.45 v to be used in the calculation to select values for V1.

The reason for selecting the middle values is explained as follows. As shown in FIG. 4, value $V1'_1$ is between threshold voltage values Vt'1 and Vt'2. Since $V1'_1$ may be one of the three tracked values of $V1_1$, selecting the middle tracked values of $V1_1$ may reduce the chance of value $V1'_1$ (middle tracked value) being too close to either one of Vt'1 and Vt'2, thereby reading the information corresponding to threshold voltage values Vt'1 may reduce the chance for errors. Similarly, as shown in FIG. 4, value $V1'_{15}$ is between threshold voltage values Vt'14 and Vt'15. Since $V1'_{15}$ may be one of the three tracked values of $V1_{15}$, selecting the middle tracked values of values of $V1_{15}$ may reduce the chance of value $V1'_{15}$ (middle tracked value) being too close to either one of Vt'14 and Vt'15, thereby reading the information corresponding to threshold voltage values Vt'15 may reduce the chance for errors. The number of tracked values (three) used in activity 510 is an example. Activity 510 may operate using only one tracked value. In such a case, the activity may operate to select that the tracked value to be used in the calculation to select values for V1.

As mentioned above, methods 500 may include three different ways to select values for voltage V1 (e.g., select values $V1'_0$, $V1'_1$, and $V1'_2$ through $V1'_{15}$).

Activity 520 of methods 500 may include selecting values (new values) for voltage V1 using calculations based on three expressions (1), (2), and (3) below.

Expression (1)

$V1'_n = V1_n - [[(V1_Z - V1'_Z)/Z]*n]$, where "Z" is one less than the number of threshold voltage values (or states), where "n" is an integer less than or equal to Z, and $V1'_n$ corresponds to a value of voltage V1 that may be used to read the information corresponding to a threshold voltage value (or state) among "Z+1" threshold voltage values (or Z+1 states), e.g. threshold voltage values Vt'0 through Vt'15 when Z=15 for a 4-bit cell. Values $V1_1$ and $V1_Z$ are known values. Value $V1'_Z$ may be obtained by activity 510 above. Based on expression (1), each of values of $V1'_0$, $V1'_1$, and $V1'_2$ through $V1'_{15}$ of voltage V1 may be calculated. For example, to calculate value $V1'_2$ (used to read the information corresponding to Vt2 or state 2), then n=2; to calculate $V1'_{14}$ (used to read the information corresponding to Vt2 or state 14) then n=14, and so on.

As shown in expression (1), to calculate the values $V1'_0$, $V1'_1$, and $V1'_2$ through $V1'_{15}$ of voltage V1 to read the information corresponding to Vt'0 through Vt'15, activity 520 may use the threshold voltage value with a highest value among the threshold voltage values (e.g., in FIG. 4, Vt'15 has a highest value among Vt'0 through Vt'15).

Expression (2):

$V1'_n = V1_n - [((V1_Z - V1'_Z) - (V1_1 - V1'_1))/Z]*n$, where "Z" is one less than the number of threshold voltage values (or states), where "n" is an integer less than or equal to Z, and $V1'_n$ corresponds to a value of voltage V1 that may be used to read the information corresponding to a threshold voltage value among "Z+1" threshold voltage values. $V1_1$ and $V1_{15}$ are known values. $V1'_1$ and $V1'_{15}$ may be obtained by activity 510 above. Based on expression (2), each of values of $V1'_0$, $V1'_1$, and $V1'_2$ through $V1'_{15}$ of voltage V1 may be calculated. For example, to calculate value $V1'_2$, then n=2; to calculate $V1'_{14}$ then n=14, and so on.

As shown in expression (2), to calculate the values $V1'_0$, and $V1'_{15}$ of voltage V1 to read the information corresponding to Vt'0 through Vt'15, activity 520 may use the threshold voltage values with a highest value and a lowest positive value among the threshold voltage values (e.g., in FIG. 4, Vt'15 has a highest value among Vt'0 through Vt'15, and Vt'1 has a lowest positive value among Vt'0 through Vt'15)

Expression (3):

$V1'_n = V1_n - [((V1_Z - V1'_Z)/m * (n - (15 - m)))]$, where "Z" is one less than the number of threshold voltage values (or states), where "n" is an integer less than or equal to Z, and $V1'_n$ corresponds to a value of voltage V1 that may be used to read the information corresponding to a threshold voltage value among "Z+1" threshold voltage values. "m" is in an integer corresponding to the number of states between value $Vt_{NEUTRAL}$ and the value of voltage V1 to read the information corresponding to the threshold voltage value having the highest value (e.g., value $V1_{15}$ in FIG. 3). $V1_1$ and $V1_{15}$ are known values. $V1'_1$ and $V1'_{15}$ may be obtained by activity 510 above. Based on expression (3), each of values $V1'_0$, $V1'_1$, and $V1'_2$ through $V1'_{15}$ of voltage V1 may be calculated. For example, if $Vt_{NEUTRAL}$ (as shown in FIG. 3) is 0.9 volt, and $V1_1$ through $V1_{15}$ are linearly set on the vertical axis of FIG. 3 such that $V1_1$, $V1_2$, $V1_3$ (not shown in FIG. 3), $V1_4$ (not shown in FIG. 3), and $V1_{15}$ have known values of 0.3 v, 0.6 v, 0.9 v, 1.2 v, and 4.5 v, then the number of states (m) between value $Vt_{NEUTRAL}$ and threshold voltage value $V1_{15}$ is m=12 (i.e., m includes state 4, state 5, and state 6 through state 15). In this example ($Vt_{NEUTRAL}$ is 0.9 volt), to calculate value $V1'_{10}$, then in expression (3), n=2 and m=12. Thus, $V1'_{10} = V1_{10} - [((V1_Z - V1'_Z)/12) * (10 - (15-12))]$. By substituting appropriate values into expression (3), the value of $V1'_{14}$ may be calculated. Other values of $V1'_1$ and $V1'_{15}$ may be calculated in a similar manner.

In summary, activity 510 of methods 500 may perform at least one read operation to select values such as $V1'_1$ and $V1'_{15}$. And activity 520 may perform calculations based on expressions (1), (2), and (3) using $V1'_1$ and $V1'_{15}$ to select values for voltage V1 including $V1'_0$, $V1'_1$, and $V1'_2$ through $V1'_{15}$.

Activity 530 of methods 500 may include reading at least a portion of the memory cells of the memory device using the selected values for V1. For example, activity 530 may use the selected values to read selected memory cells (e.g., memory cells 211), and then transfer the information read from the memory cells to terminals of the memory device (e.g., terminals similar to or identical to terminals 110 of FIG. 1) for further processing. In another example, activity 530 may use the selected values to read other selected memory cells (e.g., memory cells 212) in response to another read command (different from the read command received by activity 510). Then, activity 530 may transfer the information read from the other selected memory cells (e.g., from memory cells 212) to terminals of the memory device (e.g., terminals similar to or identical to terminals 110 of FIG. 1) for further processing.

Methods 500 may include performing at least one of activities 510, 520, and 530 to select the values for voltage V1 (value $V1'_0$, $V1'_1$, $V1'_2$, and $V1'_3$ through $V1'_{15}$) every time the memory device receives a read command from an external device (e.g., a processor or a memory controller).

Methods 500 may also include performing at least one of activities 510, 520, and 530 in a time-based fashion (e.g., on a periodic basis, and not each and every instance the memory device receives a read command from an external device) to select the values for voltage V1. Methods 500 may store the selected values (store $V1'_0$, $V1'_1$, and $V1'_2$ through $V1'_{15}$), and then use the same stored values for different read operations in response to different read commands received by the memory device at different times. In this time-based operation, methods 500 may perform activity 510 after a selected time interval (e.g., X days, where X is a real number) to select new values for voltage V1 (new $V1'_0$, $V1'_1$, and $V1'_2$ through $V1'_{15}$) and then replace the stored values with the new values. The memory device may include a storage unit (similar to or identical to storage unit 120 of FIG. 1) to store the selected values for voltage V1 and the value for X. The value of X may determine when methods 500 may start to perform at least one of activities 510, 520, and 530 to select the values for voltage V1. The memory device may include a real-time clock to start methods 500 based on the value of X. For example, if X is 30 days, then every 30 days, methods 500 may perform at least one of activities 510, 520, and 530 to select the values for voltage V1. Thus, as described herein, X may be considered as an indication that may be stored such that methods 500 may perform at least one of activities 510, 520, and 530 to select the values for voltage V1 when X (the indication) reaches a selected time value (e.g., measured in X days or a fraction of a day, or X hours, etc.).

Methods 500 may operate to read only one group of selected memory cells (e.g., memory cells 211 in FIG. 2) to select the values for voltage V1 and then use the same selected values for other memory cells (e.g., memory cells 210, 212, and 213) when the other memory cells are selected to be read (e.g., in a subsequent read operation at another time).

Methods 500 may also operate to select the values of voltage V1 separately for each group of memory cells. For example, methods 500 may include performing at least one of activities 510, 520, and 530 four times to select four sets of values for voltage V1, where each set is selected from reading a corresponding selected group of memory cells in different read operation (e.g., read operation performed by activity 510). For example, methods 500 may select a first set of values of voltage V1 (a set of $V1'_0$, $V1'_1$, and $V1'_2$ through $V1'_{15}$) from reading for the group of memory cells 210, a second set of values of voltage V1 from reading for the group of memory cells 211, a third set of values of voltage V1 from reading for the group of memory cells 212, and a fourth set of values of voltage V1 from reading for the group of memory cells 213. In a subsequent read operation (e.g., read operation performed by activity 530), methods 500 may use the corresponding set of $V1'_0$, $V1'_1$, and $V1'_2$ through $V1'_{15}$ (e.g., first set) to read the corresponding group of memory cells (e.g., the group of memory cells 210).

The description above uses an example where each of the memory cells includes a 4-bit cell. Thus, methods 500 uses expressions (1), (2), and (3) above with values for a 4-bit per cell memory device. For a memory device with a different number of bits per cell, methods 500 may also use the expressions (1), (2), and (3) above, but with different values. For example, for a 3-bit cell memory device where each memory cell has a threshold voltage corresponding to one of eight states (one of state 0 through state 7), methods 500 may use expressions (4), (5), and (6) based on expressions (1), (2), and (3) respectively, as follows. For eight states (i.e., substituting Z=7 in expressions (1), (2), and (3) above).

$$V1'_n = V1_n - [[(V1_7 - V1'_7)/7]*n]  \quad \text{(expression (4))}$$

$$V1'_n = V1_n - [((V1_7 - V1'_7) - (V1_1 - V1'_1))/7]*n  \quad \text{(expression (5))}$$

$$V1'_n = V1_n - [((V1_7 - V1'_7)/m)*(n-(7-m))],  \quad \text{(expression (6))}$$

In the above description with reference to FIG. 5, methods 500 may select values for a voltage V1 that a memory device, such as memory device 200 of FIG. 2, may apply to a line associated with selected memory cells of a memory device during a read operation. For unselected memory cells, a memory device, such as memory device 200 of FIG. 2, may apply a voltage (e.g., voltage V2 of FIG. 2) with a value selected by a method described below with reference to FIG. 6.

Figure 6:
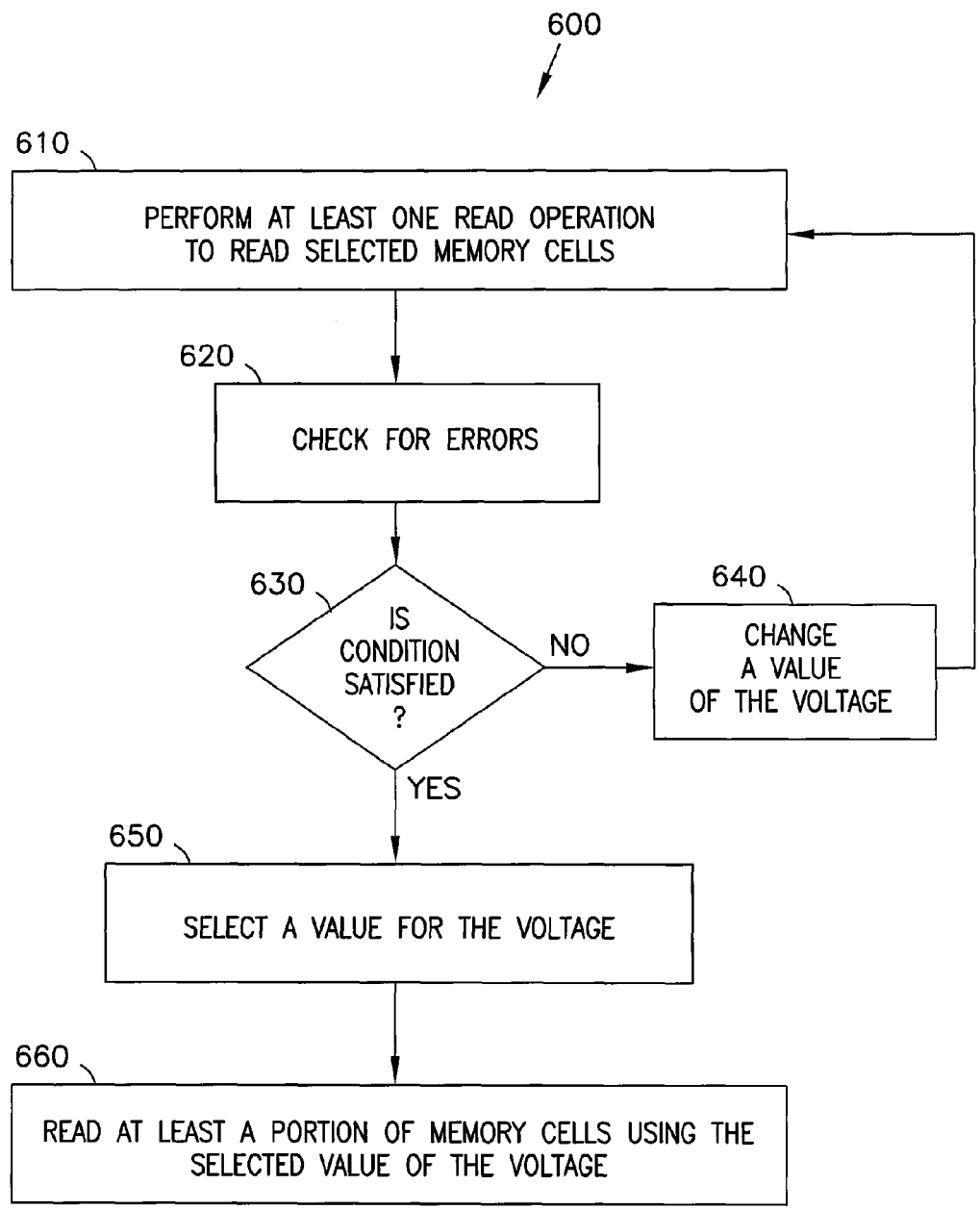
FIG. 6 is a flow diagram showing methods of selecting value for another voltage to be applied to lines associated with unselected memory cells of a memory device during a read operation according to an embodiment of the invention.

FIG. 6 is a flow diagram showing methods 600 of selecting a value for a voltage V2 to be applied to lines associated with unselected memory cells of a memory device during a read operation according to an embodiment of the invention. The memory device used in methods 600 may be associated with memory device 200 of FIG. 2. The selected memory cells in methods 600 may be associated with memory cells 211 of FIG. 2. The unselected memory cells in methods 600 may be associated with memory cells 210, 212, and 213 of FIG. 2. Methods 600 may operate to select the value for V2 based on a result of at least one operation to check for errors in information read from the selected memory cells.

Activity 610 of methods 600 may include performing at least one read operation to read selected memory cells of the memory device (e.g., memory cells 211 of FIG. 2). Activity 610 may start performing the read operation when the memory device receives a read command from an external device such as a processor. Activity 610 may include generating one or more internal read commands to perform the read operations for the purposes of selecting (e.g., calibrating) the values for voltage V1 as explained below. The internal read command(s) may be different from the (external) read command sent to the memory device by an external device. In some cases, activity 610 may not operate to transfer the information read from the selected memory cells to terminals of the memory device (e.g., terminals similar to or identical to terminals 110 of FIG. 1) for further processing. Instead, methods 600 may use the information for purposes of selecting (e.g., calibrating) values for voltage V1. After activity 610, methods 600 may include performing a subsequent read operation (e.g., in activity 660) using the selected values for V1, and then transfer the information read in the subsequent read operation to other components (e.g., to the external device) for further processing.

During the read operation, activity 610 may include applying a voltage V1 to a line associated with the selected memory cells (e.g., lines similar to or identical to lines 261 of FIG. 1). The values of V1 may include $V1_0, V1_1, V1_2$ through $V1_{15}$ or $V1'_0, V1'_1,$ AND $V1'_2$ through $V1'_{15}$ described above with reference to FIG. 4 and FIG. 5. Activity 610 in FIG. 6 may include applying a voltage V2 to lines associated with the unselected memory cells (e.g., lines similar to or identical to lines 260, 262, and 263 of FIG. 2).

Activity 620 may include checking for errors in information read from the selected memory cells. An error correction unit, such as error correction unit 118 of FIG. 1, may perform an error checking operation to check for errors and give a result. The information read from the selected memory cells may include a number of bits of data. Checking for errors in activity 620 may include identifying a failure bit quantity, which is a total number of bits (among the bits of data read from the selected memory cells) having errors. The value of the failure bit quantity may be zero, one, two, three, or some other value. Methods 600 may use the failure bit quantity as a result that other activities of methods 600, such as activity 630 below, may use.

Activity 630 may include determining whether the result (i.e., the failure bit quantity) satisfies a condition. The memory device used in methods 600 may set the condition in a storage unit such as storage unit 120 of FIG. 1. For example, the memory device may set the condition such that the result (obtained by activity 620) may satisfy the condition if at least one of the following is true: the failure bit quantity is equal to zero, the failure bit quantity is greater than zero and less than a particular value (e.g., greater than zero and less than eight), or the failure bit quantity is a lowest value among at least two failure bit quantities (e.g., failure bit quantities obtained from at least two read operations). Activity 630 may compare the result of checking for errors (e.g., value of the failure bit quantity) with the condition (e.g., a value stored in the storage unit). Depending on the outcome of the determination by activity 630, methods 600 may continue with either activity 640 or 650. For example, if the result satisfies the condition (indicated by "YES" in FIG. 6), methods 600 may continue with activity 650, and if the result does not satisfy the condition (indicated by "NO" in FIG. 6), methods 600 may continue with activity 640.

Activity 640 may includes changing the value of voltage V2 applied to the lines associated with the unselected memory cells. Activity 640 may change the value of voltage V2 by increasing the value of voltage V2. For example, if activity 610 (performed before activity 640) applied a value of 5.0 volts for voltage V2, then activity 640 here may increase the value of V2 to 5.2 volts. This example uses an increment of 0.2 volt. The incremental value, however, may vary (e.g., the incremental value is different from 0.2 volt, such as 0.1 volt or 0.3 volt or some other value). The incremental value may also be fixed or variable. For example, activity 640 may apply an incremental value of 0.2 volt to voltage V2 in a first read operation, and then apply a varying value of voltage V2, e.g., 0.3 volt (or some other value different from 0.2 volt) in a second read operation.

For each read operation, activity 640 may track the value of V2 and the value of the failure bit quantity, e.g., by storing these tracked values in registers or entering these values as entries in a table in the storage unit of the memory device. Thus, if activity 640 performs four read operations, then activity 640 may track (e.g., store) up to four values of V2 that are used in the four operations. For example, activity 640 may operate to record four tracked values such as 5.0 v, 5.2 v, 5.4 v, and 5.6 v after four read operations of the same selected memory cells.

After changing the value of voltage V2 and tracking the value in activity 640, methods 600 may repeat activities 610, 620, and 630 (and activity if 640 when the result does not satisfy the condition) until the result satisfies the condition or until a limited number of repeats is reached, then methods 600 may continue with activity 650.

Activity 650 may include selecting a value for voltage V2. As described above, activity 640 may track the values of V2 that are used in the read operations performed by activity 610. Activity 650 here may select from among the tracked values one that corresponds to the read operation with the failure bit quantity having the lowest value. Activity 650 may store the selected value for voltage V2 in a storage unit of the memory device. Methods 600 may use the selected value for voltage V2 for subsequent read operation (e.g., read operations performed by activity 660 below).

Activity 660 of methods 600 may include reading at least a portion of the memory cells of the memory device using the selected value for voltage V2. For example, activity 660 may use the selected value during reading of selected memory cells (e.g., memory cells 211), and then transfer the information read from the memory cells to terminals (e.g., terminals similar to or identical to terminals 110 of FIG. 1) for further processing. In another example, activity 660 may use the selected value during reading other selected memory cells (e.g., memory cells 212) in response to another read command (different from the read command received by activity 610). Then, activity 660 may transfer the information read from the other selected memory cells (e.g., from memory cells 212) to terminals (e.g., terminals similar to or identical to terminals 110 of FIG. 1) for further processing.

Methods 600 may perform at least one of activities 610, 620, 630, 640, and 650 to select the value for voltage V2 every time the memory device receives a read command from an external device (e.g., a processor or a memory controller).

Methods 600 may also perform at least one of activities 610, 620, 630, 640, and 650 in a time-based fashion (e.g., on a periodic basis, and not each and every instance the memory device receives a read command from an external device) to select the value for voltage V2. Methods 600 may store the selected value, and then use the same stored value for different read operations in response to different read commands received by the memory device at different times. In this time-based operation, methods 600 may perform activity 610 after each time interval (e.g., X days, where X is a real number) to select new value for voltage V2 and then replace the stored value with the new value. The memory device may include a storage unit (similar to or identical to storage unit 120 of FIG. 1) to store the selected value for voltage V2 and the value for X. The value of X may determine when methods 600 may start to perform at least one of activities 610, 620, 630, 640, and 650 to select the value for voltage V2. The memory device may include a real-time clock to start methods 600 based on the value of X. For example, if X is 30 days, then every 30 days, methods 600 may perform at least one of activities 610, 620, 630, 640, and 650 to select the value for voltage V2. Thus, as described herein, X may be considered as an indication to be stored, so that methods 600 may perform at least one of activities 610, 620, 630, 640, and 650 to check for the errors to select the value for voltage V2 when X (the indication) reaches a selected time value (e.g., measured in days or a fraction of a day, or X hours, etc.).

Methods 600 may operate to read only one group of selected memory cells (e.g., memory cells 211 in FIG. 2) to select the value for voltage V2 and then use the same selected value for other memory cells (e.g., memory cells 210, 212, and 213) when the other memory cells are selected to be read (e.g., in a subsequent read operation at another time).

Methods 600 may also operate to select the value of voltage V2 separately for each group of memory cells. For example, methods 600 may perform at least one of activities 610, 620, 630, 640, and 650 four times to select four values for voltage V2, where each value is selected from reading a corresponding selected group of memory cells in different read operation (e.g., read operation performed by activity 610). For example, methods 600 may operate to select a first value of voltage V2 from reading the group of memory cells 211, 212, and 213, a second value of voltage V2 from reading the group of memory cells 210, 212, and 213, a third value of voltage V2 from reading the group of memory cells 210, 211, and 213, and a fourth value of voltage V2 from reading the group of memory cells 210, 211, and 212. In a subsequent read operation (e.g., read operation performed by activity 660), methods 600 may use the corresponding selected value of V2 (first value) to read the corresponding group of memory cells (e.g., the group of memory cells 211, 212, and 213). In summary, the description above with reference to FIG. 6 shows a method of selecting a value for voltage V2. A memory device, such as memory device 100 or 200, may apply the selected value to lines associated with unselected memory cells during a read operation.

Figure 7:
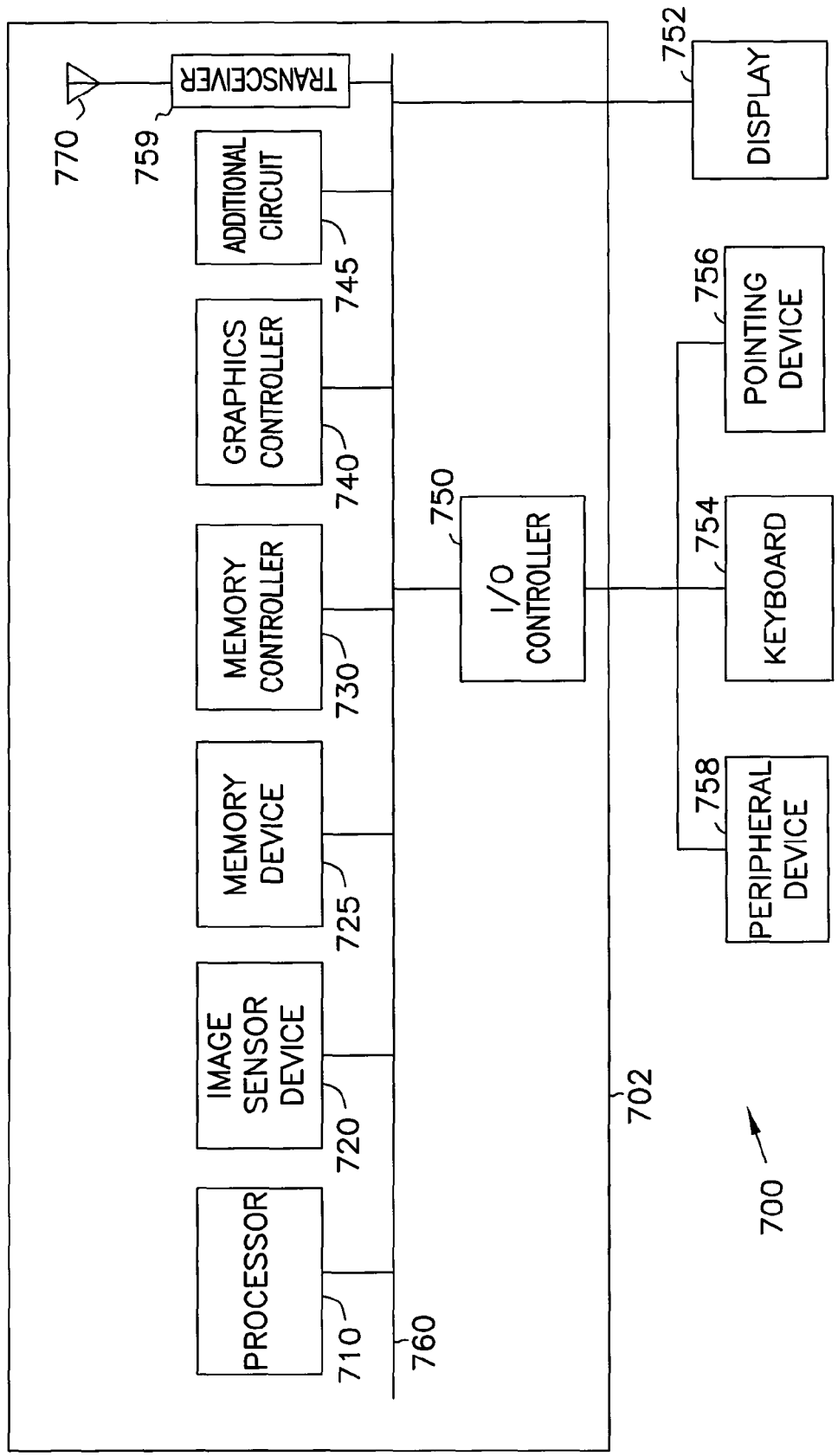
FIG. 7 shows a system according to an embodiment of the invention.

FIG. 7 shows a system 700 according to an embodiment of the invention. System 700 may include a processor 710, an image sensor device 720, a memory device 725, a memory controller 730, a graphics controller 740, an additional circuit 745, an input and output (I/O) controller 750, a display 752, a keyboard 754, a pointing device 756, a peripheral device 758, a transceiver 759, a bus 760 to transfer information among the components of system 700, and an antenna 770 to wirelessly transmit and receive information to and from system 700. Transceiver 759 may operate to transfer information from one or more of the components of system 700 (e.g., at least one of processor 710 and memory device 725) to antenna 770. Transceiver 759 may also operate to transfer information received at antenna 770 to at least one of the processor 710 and the memory device 725. The information received at antenna 770 may be transmitted to system 700 by a source external to system 700.

Processor 710 may include a general-purpose processor or an application specific integrated circuit (ASIC). Processor 710 may include a single core processor or a multiple-core processor. Processor 710 may execute one or more programming commands to process information. The information may include digital output information provided by other components of system 700, such as by image sensor device 720 or memory device 725.

Image sensor device 720 may include a complementary metal-oxide-semiconductor (CMOS) image sensor having a CMOS pixel array or charge-coupled device (CCD) image sensor having a CCD pixel array.

Memory device 725 may include a volatile memory device, a non-volatile memory device, or a combination of both. For example, memory device 725 may comprise a dynamic random access memory (DRAM) device, a static random access memory (SRAM) device, a flash memory device, or a combination of these memory devices. Memory device 725 may include one or more of the various embodiments described herein, such as memory devices 100 and 200.

Display 752 may include an analog display or a digital display. Display 752 may receive information from other components. For example, display 752 may receive information that is processed by one or more of image sensor device 720, memory device 725, graphics controller 740, and processor 710 to display information such as text or images.

Additional circuit 745 may include circuit components used in a vehicle. Additional circuit 745 may receive information from other components to activate one or more subsystem of the vehicle. For example, additional circuit 745 may receive information that is processed by one or more of image sensor device 720, memory device 725, and processor 710, to activate one or more of an air bag system of a vehicle, a vehicle security alarm, and an obstacle alert system.

The illustrations of apparatus (e.g., memory devices 100 and 200) and systems (e.g., system 700) are intended to provide a general understanding of the structure of various embodiments and are not intended to provide a complete description of all the elements and features of apparatus and systems that might make use of the structures described herein.

Any of the components described above can be implemented in a number of ways, including simulation via software. Thus, apparatus (e.g., a portion of memory device 100 or the entire memory device 100, and portion of memory device 200 or the entire memory device 200) and systems (e.g., a portion of system 700 or the entire system 700) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100 and 200) and systems (e.g., system 700), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The novel apparatus and systems of various embodiments may include or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others The embodiments described above with reference to FIG. 1 through FIG. 7 may include first memory cells and a first line used to access the first memory cells, second memory cells and at least one second line used to access the second memory cells. The first and second memory cells have a number of threshold voltage values corresponding to a number of states. The states represent values of information stored in the memory cells. During a read operation to read the first memory cells, a first voltage may be applied to the first line and a second voltage may be applied to the second line. At least one of the first and second voltages may include a value based on a change of at least one of the threshold voltage values from a first value to a second value. The first and second values may correspond to a unique state selected from the available states. Other embodiments including additional apparatus, systems, and methods are disclosed.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is checked by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
   a line to receive a voltage;
   a module configured to calculate a voltage value of the voltage in a read operation in a memory device to read at least one of the memory cell associated with the line, wherein the voltage value is calculated based at least in part on a threshold voltage value of at least one memory cell of the device; and
   an additional line to receive an additional voltage, wherein the module is configured to select an additional voltage value of the additional voltage in the read operation, wherein the additional voltage value is calculated based on a result of at least one operation to check for errors in information read from at least one memory cell of the device.

2. The apparatus of claim 1, wherein the module is configured to calculate the voltage value based at least in part on a highest threshold voltage value among threshold voltage values of memory cells of the device.

3. The apparatus of claim 1, wherein the module is configured to calculate the voltage value based at least in part on a highest value and a lowest positive value among threshold voltage values of memory cells of the device.

4. The apparatus of claim 1, wherein the module is configured to periodically calculate the voltage value.

5. An apparatus comprising:
   a line associated with at least some of memory cells of a memory device; and
   a module configured to apply a voltage to read at least one of the memory cells during a read operation, the voltage having a voltage value based on a time value, wherein the module is configured to store the time value that corresponds to a number of days.

6. The apparatus of claim 5, wherein the module is configured to periodically read at least one the memory cells to select the voltage value.

7. An apparatus comprising:
a line associated with at least some of memory cells of a memory device; and
a module configured to apply a voltage to read at least one of the memory cells during a read operation, the voltage having a voltage value based on a time value, wherein the module is configured to apply the voltage with different voltage values at different time values.

8. An apparatus comprising:
a line associated with at least some of memory cells of a memory device; and
a module configured to apply a voltage to read at least one of the memory cells during a read operation, the voltage having a voltage value based on a time value, wherein the module is configured to read at least one of the memory cells in an additional read operation to select the voltage value.

9. The apparatus of claim 8, wherein the module is configured to perform the read operation in response to receiving a read command, and wherein the additional read operation is performed each time the read command is received.

10. An apparatus comprising:
a first line and a second line; and
a module configured to apply a first voltage to the first line and a second voltage to the second line to read memory cells associated with the first line, the memory cells configured to have a number of threshold voltage values corresponding to a number of states, wherein the first voltage includes a value based on a change of at least one of the number of threshold voltage values including a first threshold voltage value of the threshold voltage values changing from a first value to a second value, wherein the first and second values correspond to only one state of the number of states, wherein the module is configured to select the value of the first voltage based on a reading, during an additional read operation, of at least one of the first memory cells and second memory cells associated with the second line, wherein the additional read operation is performed before the read operation.

11. The apparatus of claim 10, wherein the module is configured to store an indication to perform the additional read operation when the indication reaches a selected time value.

12. An apparatus comprising:
a first line and a second line; and
a module configured to apply a first voltage to the first line and a second voltage to the second line to read memory cells associated with the first line, the memory cells configured to have a number of threshold voltage values corresponding to a number of states, wherein the first voltage includes a value based on a change of at least one of the number of threshold voltage values including a first threshold voltage value of the threshold voltage values changing from a first value to a second value, wherein the first and second values correspond to only one state of the number of states, wherein the module is configured to track values of the first voltage used during a reading of the first memory cells before the read operation.

13. A method comprising:
applying a voltage having a first voltage value, during a first time interval, to a line associated with memory cells to read a selected memory cell among the memory cells; and
applying the voltage having a second voltage value, at a second time interval after the first time interval, to the line to read the selected memory, wherein the selected memory cell has a same state during the first time interval and the second time interval.

14. The method of claim 13, wherein the second voltage value is less than the first voltage value.

15. The method of claim 13, wherein the second voltage value is calculated based at least in part on a threshold voltage value of at least one of the memory cells.

16. The method of claim 13, wherein the second voltage value is calculated based at least in part on a highest threshold voltage value among threshold voltage values of the memory cells.

17. The method of claim 13, wherein the second voltage value is calculated based at least in part on a highest value and a lowest positive value among threshold voltage values of the memory cells.

* * * * *

UNITED STATES PATENT AND TRADEMARK OFFICE
CERTIFICATE OF CORRECTION

| | | |
|---|---|---|
| PATENT NO. | : 8,018,778 B2 | Page 1 of 1 |
| APPLICATION NO. | : 12/846596 | |
| DATED | : September 13, 2011 | |
| INVENTOR(S) | : Seiichi Aritome | |

It is certified that error appears in the above-identified patent and that said Letters Patent is hereby corrected as shown below:

In column 16, line 66, in Claim 6, delete "one the memory" and insert -- one of the memory --, therefor.

Signed and Sealed this
Eighth Day of November, 2011

David J. Kappos
*Director of the United States Patent and Trademark Office*